United States Patent
Amou et al.

(10) Patent No.: US 7,273,900 B2
(45) Date of Patent: Sep. 25, 2007

(54) RESIN COMPOSITION, PREPREG, LAMINATE SHEET AND PRINTED WIRING BOARD USING THE SAME AND METHOD FOR PRODUCTION THEREOF

(75) Inventors: Satoru Amou, Hitachi (JP); Morimichi Umino, Hitachiota (JP); Akira Nagai, Hitachi (JP); Yoshihiro Nakamura, Shimodate (JP); Nobuyuki Minami, Shimodate (JP)

(73) Assignee: Hitachi Chemical Company, Ltd., Tokyo (JP)

( * ) Notice: Subject to any disclaimer, the term of this patent is extended or adjusted under 35 U.S.C. 154(b) by 0 days.

(21) Appl. No.: 10/935,266

(22) Filed: Sep. 8, 2004

(65) Prior Publication Data

US 2005/0064159 A1    Mar. 24, 2005

(30) Foreign Application Priority Data

Sep. 19, 2003   (JP)   ............... 2003-327970

(51) Int. Cl.
*C08F 8/00*   (2006.01)
(52) U.S. Cl. .............. 524/81; 524/125; 524/151; 524/186; 525/242; 525/255
(58) Field of Classification Search ............ 525/242, 525/255; 524/81, 125, 151
See application file for complete search history.

(56) References Cited

U.S. PATENT DOCUMENTS

| | | | | |
|---|---|---|---|---|
| 5,126,192 | A * | 6/1992 | Chellis et al. | 428/323 |
| 6,001,909 | A * | 12/1999 | Setiabudi | 524/265 |
| 6,420,476 | B1 | 7/2002 | Yamada et al. | |
| 6,500,535 | B1 | 12/2002 | Yamada et al. | |
| 6,521,703 | B2 | 2/2003 | Zarnoch et al. | |
| 6,905,637 | B2 * | 6/2005 | Yeager et al. | 252/511 |
| 2002/0161091 | A1 * | 10/2002 | Amou et al. | 524/425 |
| 2004/0039127 | A1 * | 2/2004 | Amou et al. | 525/328.9 |

FOREIGN PATENT DOCUMENTS

| | | |
|---|---|---|
| JP | 2002-249531 | 9/2002 |
| JP | 2003-12710 | 1/2003 |
| JP | 2003-105036 | 4/2003 |

OTHER PUBLICATIONS

Satoru, electronic translation of JP 2003-12710, Jan. 2003, (p. 1-22).*
Satoru, electronic translation of JP 2003-105036 (p. 1-12).*

* cited by examiner

*Primary Examiner*—Jeffrey Mullis
(74) *Attorney, Agent, or Firm*—Antonelli, Terry, Stout & Kraus, LLP

(57) ABSTRACT

There are provided a resin composition comprising a crosslinking component with a weight average molecular weight of 1,000 or less having a plurality of styrene groups and represented by the following formula:

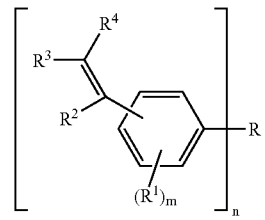

wherein R is a hydrocarbon skeleton, each of $R^1$s is a hydrogen atom or a hydrocarbon group, each of $R^2$, $R^3$ and $R^4$ is a hydrogen atom or an alkyl group, m is an integer of 1 to 4, and n is an integer of 2 or more, at least one high-molecular weight compound, an inorganic filler, and at least one treating agent for said inorganic filler; its cured product; and a prepreg, a laminate sheet having a conductor layer, and a multilayer printed wiring board obtained by processing the conductor layer of the laminate sheet into wiring.

9 Claims, 2 Drawing Sheets

RESIN COMPOSITION, PREPREG, LAMINATE SHEET AND PRINTED WIRING BOARD USING THE SAME AND METHOD FOR PRODUCTION THEREOF

The present application claims priority from Japanese application JP 2003-327970 filed on 19 Sep. 2003, the content of which is hereby incorporated by reference into this application.

TECHNICAL FIELD

The present invention relates to a multilayer printed wiring board, a conductor-provided laminate sheet, a prepreg and a resin-layer-provided conductor foil which are sufficiently low in dielectric loss to be suitable for high-frequency signals, and a resin composition with a low dielectric loss tangent property used for producing them, its cured product, prepreg, laminate sheet and a multilayer printed wiring board and the like.

BACKGROUND ART

In recent years, the signal frequency region for information and communication apparatus (e.g., PHS and mobile phones) and the CPU clock time of computers reach the GHz region and employment of a higher frequency has been in progress. The transmission loss of an electric signal is expressed as the sum of dielectric loss, conductor loss and radiation loss, and the dielectric loss, conductor loss and radiation loss increase with an increase of the frequency of the electric signal. Since the transmission loss decays the electric signal to deteriorate the reliability of the electric signal, a wiring board for high-frequency signals should be designed to suppress the increase of the dielectric loss, conductor loss and radiation loss. The dielectric loss is proportional to the product of the square root of the relative permittivity of an insulator forming a circuit, the dielectric loss tangent of the insulator and the frequency of signals used. Therefore, the increase of the dielectric loss can be suppressed by choosing an insulating material having a low permittivity and a low dielectric loss tangent, as the insulator.

Typical materials having a low permittivity and a low dielectric loss tangent are described below. Fluororesins represented by polytetrafluoroethylenes (PTFE) have both a low permittivity and a low dielectric loss tangent and hence have been used as a material for a substrate suitable for high-frequency signals since early times. On the other hand, various insulating materials containing no fluorine and having a low permittivity and a low dielectric loss tangent have been investigated which are easy to make into a varnish by the use of an organic solvent, have a low molding temperature and a low curing temperature, and are easy to handle. JP-A-2002-249531, JP-A-2003-12710 and JP-A-2003-105036 disclose examples of employment of a polyfunctional styrene compound as a crosslinking component. In addition, in many of these examples, permittivity adjustment, flame retardation and strength improvement by the addition of an inorganic filler are described.

It is generally known that the conductor loss and the radiation loss can be reduced by forming a conductor wiring with a low surface roughness by the use of a metal having a low conductor resistance, such as gold, silver, copper or the like.

The cured products of resin compositions and prepregs disclosed in JP-A-2002-249531, JP-A-2003-12710 and JP-A-2003-105036 are materials having a low permittivity but have a dielectric loss tangent of more than 0.002. Thus, they are still unsatisfactory as an insulating material in their recent application at a high frequency. The present inventor investigated a method for further reducing the dielectric loss tangent of the cured products of resin compositions and prepregs, and consequently found that the dielectric loss tangent (dielectric loss) of the cured products could be reduced by adding a specific treating agent to the resin compositions or previously treating an inorganic filler, a base material (e.g., glass cloth), copper foil or the like.

Accordingly, an object of the present invention is to reduce the dielectric loss tangent of a cured product of a resin composition containing a crosslinking component having a plurality of styrene groups, a high-molecular weight compound and an inorganic filler.

Another object of the present invention is to provide a resin composition having both an excellent flame retardancy like that of the above-mentioned resin composition and a very low dielectric loss tangent and further provide a printed wiring board, a laminate sheet, a prepreg and a resin-layer-provided conductor foil which are obtained by using the resin composition.

SUMMARY OF THE INVENTION

The present invention includes, at least, the following items.

(1) A resin composition comprising:

a crosslinking component with a weight average molecular weight of 1,000 or less having a plurality of styrene groups and represented by the following general formula:

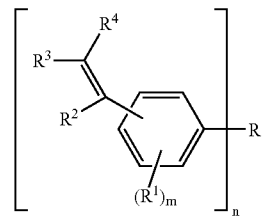

wherein R is a hydrocarbon skeleton; each of $R^1$s, which may be the same or different, is a hydrogen atom or a hydrocarbon group of 1 to 20 carbon atoms; each of $R^2$, $R^3$ and $R^4$, which may be the same or different, is a hydrogen atom or an alkyl group of 1 to 6 carbon atoms; m is an integer of 1 to 4; and n is an integer of 2 or more, at least one high-molecular weight compound with a weight average molecular weight of 5,000 or more, and an inorganic filler having a dielectric loss tangent of 0.002 or less, said resin composition further comprising at least one treating agent for said inorganic filler.

(2) The composition according to the item (1), wherein said treating agent(s) is supported on the surface of the inorganic filler.

(3) The composition according to the item (1) or (2), which contains, as said at least one treating agent, at least one reactive treating agent having a functional group chemically bondable to the polyfunctional styrene compound.

(4) The composition according to any one of the items (1) to (3), wherein the average particle size of said inorganic filler ranges 0.5 to 60 µm.

(5) The composition according to any one of the items (1) to (4), wherein said at least one high-molecular weight compound is at least one resin selected from the group consisting of polymers comprising repeating units derived from at least one of butadiene, isoprene, styrene, methylstyrene, ethylstyrene, divinylbenzene, acrylic esters, acrylonitrile, N-phenylmaleimide and N-vinylphenyl-maleimide; substituted or unsubstituted polyphenylene oxides; and polyolefins having an alicyclic structure.

(6) The composition according to any one of the items (1) to (5), which further comprises at least one of a curing catalyst capable of polymerizing styrene groups and a polymerization inhibitor capable of suppressing the polymerization of styrene groups.

(7) The composition according to any one of the items (1) to (6), which further comprises at least one flame retardant.

(8) The composition according to the item (7), which comprises at least one at least one flame retardant having a dielectric loss tangent of 0.002 or less, as the above-mentioned at least one flame retardant.

(9) The composition according to the item (7) or (8), which comprises at least one flame retardant represented by the following general formulas, as the above-mentioned at least one flame retardant:

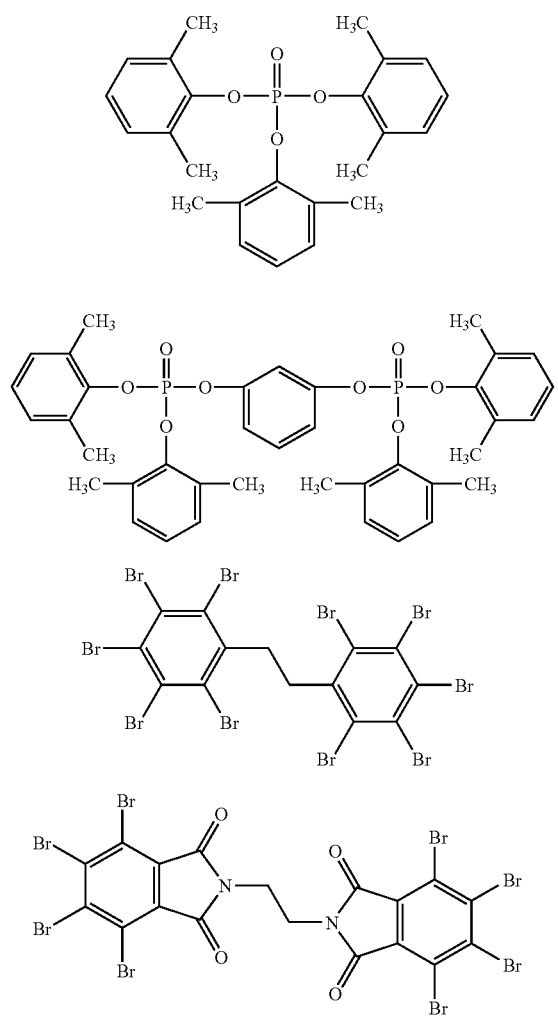

(10) A cured product of a composition according to any one of the above items (1) to (9).

(11) A prepreg obtained by impregnating glass cloth or glass nonwoven fabric with a composition according to any one of the above items (1) to (9), and drying the composition.

(12) The prepreg according to the item (11), wherein said glass cloth or glass nonwoven fabric has been subjected to surface treatment with at least one treating agent.

(13) The prepreg according to the item (12), characterized by containing at least one reactive treating agent having a functional group chemically bondable to the polyfunctional styrene compound, as said at least one treating agent.

(14) The prepreg according to any one of the items (11) to (13), wherein the dielectric loss tangent of said glass cloth or glass nonwoven fabric is 0.002 or less.

(15) A cured product of a prepreg according to any one of the above items (11) to (14).

(16) A laminate sheet obtained by providing a conductor layer on one or both sides of a cured product of a prepreg according to the above item (15).

(17) The laminate sheet according to the item (16), wherein the average of surface roughness values at 10 points of the surface of said conductor layer in contact with the prepreg ranges from 1 to 3 µm.

(18) The laminate sheet according to the item (17), wherein the surface of said conductor layer in contact with the prepreg has been treated with a treating agent.

(19) The laminate sheet according to the item (18), which contains at least one reactive treating agent having a functional group chemically bondable to the polyfunctional styrene compound, as said at least one treating agent.

(20) A multilayer printed wiring board obtained by processing the conductor layer of a laminate sheet according to any one of the above items (16) to (19) into wiring, laminating such laminate sheets with prepregs inserted between the laminate sheets so as to alternate with them, and then adhering the laminate sheets to one another.

(21) A resin-layer-provided conductor foil obtained by applying a resin composition according to any one of the above items (1) to (9) on one side of conductor foil and then drying the composition.

(22) The resin-layer-provided conductor foil according to the item (21), wherein the average of surface roughness values at 10 points of the surface of said conductor foil in contact with the resin layer is 1 to 3 µm.

(23) The resin-layer-provided conductor foil according to the item (22), wherein the surface of said conductor foil in contact with the resin layer has been treated with a treating agent.

(24) The resin-layer-provided conductor foil according to the item (23), which contains at least one reactive treating agent having a functional group chemically bondable to the polyfunctional styrene compound, as said at least one treating agent.

(25) A laminate sheet obtained by attaching second conductor foil to a resin-layer-provided conductor foil according to any one of the above items (21) to (24) through the resin layer of the resin-layer-provided conductor foil to laminate the conductor foils, and adhering them to each other.

(26) A multilayer printed wiring board obtained by forming wiring in a laminate sheet having a conductor layer on the surface, laminating a resin-layer-provided conductor foil according to any one of the above items (21) to (24) on the laminate sheet, adhering them to each other, and then processing the conductor foil as outer layer into wiring.

(27) A multilayer printed wiring board obtained by forming wiring in a laminate sheet having a first conductor layer on the surface, applying a resin composition according to any one of the above items (1) to (9) on the surface having the wiring formed thereon, drying the composition, curing the composition if necessary, forming a second conductor layer as an outer layer, and then processing the second conductor layer as an outer layer into wiring.

Other objects, features and advantages of the invention will become apparent from the following description of the embodiments of the invention taken in conjunction with the accompanying drawings.

Figure 1:
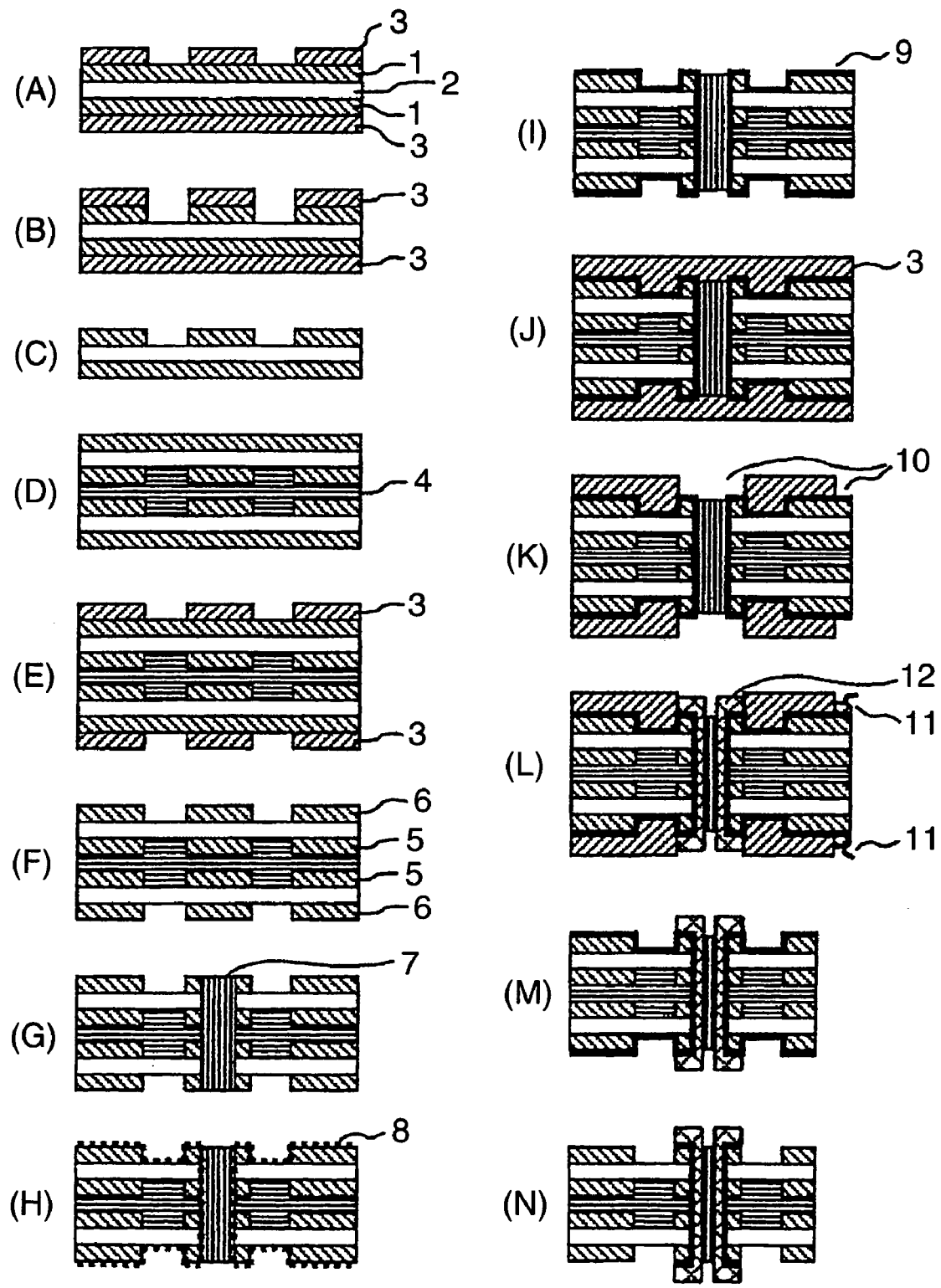
FIG. 1 is a schematic diagram showing a process for producing a multilayer wiring board in one example.

The symbols have the following meanings.

1—copper foil subjected to dielectric loss tangent reduction treatment, 2—resin substrate, 3—photoresist, 4—prepreg, 5—inner-layer wiring, 6—outer-layer wiring, 7—through-hole, 8—plating catalyst, 9—seed film, 10—opening, 11—electrode, 12—plated copper film, 13—resin layer.

DETAILED DESCRIPTION OF THE INVENTION

According to the present invention, a cured product can be obtained which has a very low dielectric loss tangent, a high glass transition temperature and an excellent flame retardancy.

It has been already mentioned that an insulator comprising a polyfunctional styrene compound as a crosslinking component has a very low dielectric loss tangent. The polyfunctional styrene compound can be improved in properties such as mechanical properties, adhesiveness, film-forming properties and the like by blending with various high-molecular weight compounds, and can be given flame retardancy by the addition of a flame retardant. Many blending polymers and flame retardants, however, have a higher dielectric loss tangent in some cases than does a cured product of the polyfunctional styrene compound. Therefore, the low dielectric loss tangent due to the polyfunctional styrene compound was often increased in a cured product of a resin composition that was tried to be improved in mechanical properties, adhesiveness, film-forming properties and flame retardancy by polymer blending and the addition of a flame retardant.

As to a method for suppressing the increase of the dielectric loss tangent, the addition of an inorganic filler having a very small dielectric loss tangent value and the relationship between the structure of a flame retardant and its dielectric loss tangent were investigated. Consequently, it was found that in the case of a resin composition whose dielectric loss tangent after curing is 0.002 or less, the dielectric loss tangent of a cured product of the composition is often not reducible by mere addition of an inorganic filler having a low dielectric loss tangent to a resin system. As causes for this problem, there are conjectured peeling of the resin and the inorganic filler from each other at the boundary surface between them and the adsorption of a slight amount of impurities (e.g., water) on the peeled portions which accompanies the peeling.

The problem will be solvable by modifying the surface of the inorganic filler with a specific treating agent to increase its adhesion to the resin. It was also found that the dielectric loss tangent of a flame retardant having a specific structure is very low and that the dielectric loss tangent of a resin composition containing the flame retardant is also very low. Thus, also when no polyolefin is used as a blending polymer, a resin composition can be obtained which have not only a very low dielectric loss tangent but also flame retardancy. Moreover, it was found that also in the case of a cured product of a prepreg obtained by impregnating glass cloth or glass nonwoven fabric with this composition and drying and then curing the composition, the dielectric loss tangent of the cured product is reduced when the surface of the glass cloth or glass nonwoven fabric is treated with a treating agent.

The term "treating agent" used in the present specification means a substance capable of reducing the dielectric loss tangent of a cured product of, for example, a resin composition or a prepreg, which comprises a polyfunctional styrene compound as crosslinking agent, at least one high-molecular weight compound having a weight average molecular weight of 5,000 or more and an inorganic filler having a dielectric loss tangent of 0.002 or less. The treating agent has a group reactive to the above-mentioned polyfunctional styrene compound or has a group adsorbable on and bondable to the inorganic filler.

Furthermore, it was found that dielectric loss tangent reduction treatment of conductor foil having an excellent transmission characteristic for high-frequency signals and a low surface roughness increases the adhesion between a cured product of the composition of the present invention and the conductor foil. On the basis of these findings, there have been obtained a printed wiring board suitable for high-frequency signals and a laminate sheet, a prepreg, a resin-layer-provided conductor foil and a resin composition which are components of the printed wiring board.

The resin composition of the present invention and its cured product are explained below. The resin composition of the present invention is a resin composition comprising a crosslinking component with a weight average molecular weight of 1,000 or less having a plurality of styrene groups and represented by the following general formula:

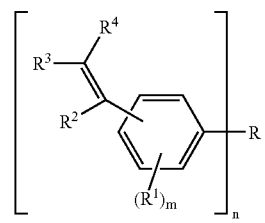

wherein R is a hydrocarbon skeleton; each of $R^1$s, which may be the same or different, is a hydrogen atom or a hydrocarbon group of 1 to 20 carbon atoms; each of $R^2$, $R^3$ and $R^4$, which may be the same or different, is a hydrogen atom or an alkyl group of 1 to 6 carbon atoms; m is an integer of 1 to 4; and n is an integer of 2 or more, at least one high-molecular weight compound with a weight average molecular weight of 5,000 or more, an inorganic filler having a dielectric loss tangent of 0.002 or less, and at least one treating agent. In the present specification, the weight average molecular weight refers to a weight average molecular weight in terms of styrene measured by gel permeation chromatography (GPC).

During the preparation of a varnish from the resin composition, the above-mentioned inorganic filler reacts with the treating agent(s) or a layer of the treating agent(s) is formed on the surface of the filler. Since the inorganic filler whose surface has been modified with the treating agent(s) is excellent in adhesion to the resin, there are prevented peeling of the resin and the inorganic filler from each other at the boundary surface between them and the intrusion of impurities into the peeled portions which accompanies the peeling. Therefore, the inorganic filler is very effective in reducing the dielectric loss tangent of a cured product of the resin composition. The same effect as above can be obtained also by incorporating the above-mentioned treating agent(s) into the resin composition after previously supporting the treating agent(s) on the inorganic filler.

The inorganic filler to be added is preferably an inorganic filler having a dielectric loss tangent lower than that of a cured product of the same resin composition as above except for containing no inorganic filler. The value of the dielectric loss tangent of the inorganic filler is preferably as low as possible. Specifically, the value of the dielectric loss tangent of the inorganic filler at a signal frequency used in a printed wiring board is lower than that of a cured product of the resin composition containing no filler and is 0.002 or less, preferably 0.001 or less.

Such an inorganic filler can be selected from, for example, various ceramics such as well-known titanium-barium-neodymium series ceramics, titanium-barium-tin series ceramics, zinc-calcium series ceramics, titanium dioxide series ceramics, barium titanate series ceramics, lead titanate series ceramics, strontium titanate series ceramics, calcium titanate series ceramics, bismuth titanate series ceramics, magnesium titanate series ceramics, zirconium titanate series ceramics, zinc titanate series ceramics, strontium zirconate series ceramics, $CaWO_4$ series ceramics, Ba(Mg, Nb)$O_3$ series ceramics, Ba(Mg,Ta)$O_3$ series ceramics, Ba(Co,Mg,Nb)$O_3$ series ceramics, Ba(Co,Mg,Ta)$O_3$ series ceramics, Ba(Zn,Nb)$O_3$ series ceramics, Ba(Zn,Ta)$O_3$ series ceramics and the like; and various glasses such as silicon dioxide, $SiO_2$—$CaO$—$Al_2O_3$—$B_2O_3$—$MgO$—$K_2O$—$Na_2O$ glass (E-glass), $SiO_2$—$Al_2O_3$—$MgO$—$K_2O$—$Na_2O$ glass (T-glass), $SiO_2$—$Al_2O_3$—$B_2O_3$—$K_2O$—$Na_2O$ glass (D-glass), $SiO_2$—$CaO$—$Al_2O_3$—$B_2O_3$—$MgO$—$K_2O$—$Na_2O$—$TiO_2$ glass (NE-glass) and the like.

These inorganic fillers may be used singly or as a composite thereof depending on their purpose such as permittivity adjustment, and may be used in the form of a balloon, a porous material, needles, a sphere or a shell having a resin phase in its center.

The particle size of the inorganic filler preferably incorporated into the resin composition of the present invention must necessarily be smaller than the thickness of the prepreg, the laminate sheet and the resin layer of the resin-layer-provided conductor foil from the viewpoint of reliability on insulation. Specifically, the major axis of the inorganic filler is 0.5 to 100 μm on an average, preferably 0.5 to 60 μm on an average, more preferably 0.5 to 30 μm on an average.

The amount of the inorganic filler added in the present invention ranges preferably from 10 to 65 vol % based on the total volume of the polyfunctional styrene compound, the high-molecular weight compound(s) and the inorganic filler from the viewpoint of film-forming properties and moldability. When the amount is less than 10 vol %, the dielectric loss tangent is not sufficiently reduced in some cases. When the amount is more than 65 vol %, the following problems are caused in some cases when the composition is made into a prepreg: the film-forming properties are deteriorated, resulting in an unsatisfactory appearance, or the moldability and adhesiveness are remarkably deteriorated. For these reasons, the amount of the inorganic filler added ranges more preferably from 10 to 50 vol %.

The treating agent(s) usable in the present invention includes silane type compounds, titanate type compounds, aluminum-containing compounds and the like. These compounds can be divided into (1) compounds which can be chemically bonded to the polyfunctional styrene compound and (2) compounds which are not chemically reactive to the aforesaid styrene compound but can be adsorbed on the inorganic filler.

The compounds of the above-mentioned group (1) include, for example, dimethylvinylmethoxysilane, methylvinyldimethoxysilane, γ-methacryloxypropyltrimethoxysilane, vinyltrichlorosilane, vinyltrimethoxysilane, vinyltriethoxy-silane, p-styryltrimethoxysilane, 3-methacryloxypropyl-methyldimethoxysilane, 3-methacryloxypropyltrimethoxy-silane and 3-acryloxypropyltrimethoxysilane.

The compounds of the above-mentioned group (2) include, for example, methyldiethoxysilane, trimethyl-methoxysilane, dimethylethoxysilane, trimethylethoxysilane, dimethylvinylethoxysilane, dimethyldiethoxysilane, methyl-trimethoxysilane, methylvinyldimethoxysilane, tetramethoxy-silane, diphenyldimethoxysilane, methyltriethoxysilane, phenyltrimethoxysilane, tetraethoxysilane, phenyltriethoxy-silane, methyldimethoxysilane, γ-aminopropyltriethoxysilane, N-(β-aminoethyl)-γ-aminopropyltrimethoxysilane, γ-glycidoxypropylmethoxysilane and γ-mercaptoxytri-methoxysilane.

In particular, the treating agents of the group (1) having a functional group reactive to a styrene group are preferably used. The above-exemplified treating agents may be used singly or as a composite thereof. The amount of the treating agent(s) added is preferably as small as possible so long as the addition of the inorganic filler is effective in reducing the dielectric loss tangent, because the residue of the treating agent(s) increases the dielectric loss tangent. Specifically, the amount of the treating agent(s) added ranges preferably from 0.01 to 5 parts by weight, more preferably from 0.01 to 2 parts by weight, per 100 parts by weight of the sum of the polyfunctional styrene compound, the high-molecular weight compound(s), the inorganic filler and other additives (e.g., the flame retardant(s) described hereinafter).

The polyfunctional styrene compound used in the present invention is preferably a compound having an overall-hydrocarbon skeleton having styrene groups or substituted styrene groups. The dielectric loss tangent of a cured product of the resin composition can be kept low by forming the crosslinking component by the use of the overall-hydrocarbon skeleton.

The preferable polyfunctional styrene compound used in the present invention is explained below. In the above general formula representing the polyfunctional styrene compound, the hydrocarbon skeleton represented by R is not particularly limited so long as it gives a weight average molecular weight of the crosslinking component of 1,000 or less. That is, although the hydrocarbon skeleton represented by R may be properly chosen depending on the presence of the substituents $R^1$, $R^2$, $R^3$ and $R^4$ in the styrene group, the sizes of the substituents, and the values of m and n, the number of carbon atoms of the hydrocarbon skeleton is generally 1 to 60, preferably 2 to 30. The hydrocarbon skeleton represented by R may be either straight chain skeleton or a branched chain skeleton, may contain one or more cyclic structures (e.g., alicyclic structures and aromatic ring structures), and may contain an unsaturated bond such as that of vinylene, ethynylene or the like.

The hydrocarbon skeleton represented by R includes, for example, ethylene, trimethylene, tetramethylene, methyltrimethylene, methyltetramethylene, pentamethylene, methylpentamethylene, cyclopentylene, cyclohexylene, phenylene, phenylenediethylene, xylylene and 1-phenylene-3-methylpropenylene.

In the above formula, the hydrocarbon group represented by $R^1$ includes, for example, straight chain or branched chain alkyl groups of 1 to 20 carbon atoms, preferably 1 to 10 carbon atoms, such as methyl, ethyl, n-propyl, isopropyl, n-butyl, isobutyl, s-butyl, pentyl, hexyl, decyl, eicosyl and the like; straight chain or branched chain alkenyl groups of 2 to 20 carbon atoms, preferably 2 to 10 carbon atoms, such as vinyl, 1-propenyl, 2-propenyl, 2-methylallyl and the like; and aryl groups such as phenyl, naphthyl, benzyl, phenethyl, styryl, cinnamyl and the like.

In the above formula, a plurality of $R^1$s are present because n is an integer of 2 or more. A plurality of $R^1$s are present also when m is an integer of 2 to 4. Such $R^1$s present in a number of two or more may be the same or different, and their bonding positions may also be the same or different.

In the above formula, the alkyl group represented by $R^2$, $R^3$ or $R^4$ includes straight chain or branched chain alkyl groups of 1 to 6 carbon atoms, such as methyl, ethyl, n-propyl, isopropyl, n-butyl, isobutyl, hexyl and the like.

In the above formula, the substituted or unsubstituted vinyl group $(R^3)(R^4)C=C(R^2)—$ is preferably present in the position meta or para to R on the benzene ring.

As the crosslinking component used in the present invention, a polyfunctional monomer with a weight average molecular weight of 1,000 or less having a plurality of substituted or unsubstituted styrene groups is preferable. Styrene group is highly reactive and has very low permittivity and dielectric loss tangent. A hydrocarbon skeleton is preferably employed as the skeleton of the crosslinking component from the viewpoint of permittivity and dielectric loss tangent. Owing to the employment, non-volatility and flexibility can be imparted to the crosslinking component without deteriorating the properties of styrene group, i.e., its low permittivity and low dielectric loss tangent.

In addition, when the crosslinking component with a weight average molecular weight of 1,000 or less is chosen, it exhibits melt fluidity at a relatively low temperature and has a good solubility in an organic solvent, so that the resin composition becomes easy to mold and make into a varnish. When the weight average molecular weight of the crosslinking component is too high, its melt fluidity is low and crosslinking occurs during molding in some cases, resulting in unsatisfactory molding. Although the weight average molecular weight of the crosslinking component is not limited so long as it is 1,000 or less, it is preferably 200 to 500.

Preferable specific examples of the crosslinking component are 1,2-bis(p-vinylphenyl)ethane, 1,2-bis(m-vinylphenyl)ethane, 1-(p-vinylphenyl)-2-(m-vinylphenyl)-ethane, 1,4-bis(p-vinylphenylethyl)benzene, 1,4-bis(m-vinylphenylethyl)benzene, 1,3-bis(p-vinylphenylethyl)benzene, 1,3-bis(m-vinylphenylethyl)benzene, 1-(p-vinylphenylethyl)-4-(m-vinylphenylethyl)benzene, 1-(p-vinylphenylethyl)-3-(m-vinylphenylethyl)benzene, and divinylbenzene polymers (oligomers) having vinyl groups in their side chains. These crosslinking components may be used singly or in combination.

One of the characteristics of the present invention is to improve the tack-free properties and the mechanical strength of the cured product by combining the above-mentioned crosslinking component and the high-molecular weight compound(s). The high-molecular weight compound(s) used in the present invention includes, for example, homopolymers or copolymers of butadiene, isoprene, styrene, methylstyrene, ethylstyrene, divinylbenzene, acrylic esters (e.g., methyl acrylate, butyl acrylate and phenyl acrylate), acrylonitrile, N-phenylmaleimide and N-vinylphenyl-maleimide; substituted or unsubstituted polyphenylene oxides; and polyolefins having an alicyclic structure. The high-molecular weight compound(s) is not limited to them. These high-molecular weight compounds may be used singly or as a composite thereof.

The molecular weight of the above-mentioned high-molecular weight compound(s) is preferably 5,000 or more from the viewpoint of tack-free properties and film-forming properties in the production of a prepreg from the resin composition. It is more preferably 10,000 to 100,000 from the viewpoint of mechanical strength. It is still more preferably 15,000 to 60,000 for making the resin composition into a varnish easily and attaining a suitable viscosity of the varnish easily.

In addition, from the viewpoint of the heat resistance of a laminate sheet obtained by the use of the resin composition, the high-molecular weight compound(s) preferably has a glass transition temperature of 170° C. or higher or an elastic modulus at 170° C. of 500 MPa or more. The high-molecular weight compound(s) more preferably has a glass transition temperature of 170 to 300° C. or an elastic modulus at 170° C. of 500 to 3000 MPa. When the high-molecular weight compound(s) has curing property, its cured product preferably has a glass transition temperature of 170° C. or higher or an elastic modulus at 170° C. of 500 MPa or more. The cured product more preferably has a glass transition temperature of 170 to 300° C. or an elastic modulus at 170° C. of 500 to 3000 MPa.

Although the amounts of the crosslinking component and high-molecular weight compound(s) incorporated into the resin composition of the present invention are not particularly limited, the crosslinking component and high-molecular weight compound(s) are preferably incorporated in proportions of 5 to 95 parts by weight and 95 to 5 parts by weight, respectively. The proportions of the crosslinking component and the high-molecular weight compound(s) are more preferably 50 to 95 parts by weight and 50 to 5 parts by weight, respectively. The proportions of the crosslinking component and the high-molecular weight compound(s) are still more preferably 50 to 80 parts by weight and 50 to 20 parts by weight, respectively. The solvent resistance, strength, film-forming properties, adhesiveness and the like of a cured product of the resin composition are preferably adjusted in the above proportion ranges.

Although the resin composition of the present invention can be cured by mere heating without adding a curing catalyst, a curing catalyst capable of polymerizing styrene groups may be added in order to improve the curing efficiency. Although the amount of the curing catalyst added is not particularly limited, it is preferably 0.0005 to 10 parts by weight per 100 parts by weight of the sum of the above-mentioned crosslinking component and high-molecular weight compound(s) because the residues of the curing catalyst tend to have undesirable influences on the dielectric characteristics. The addition of the curing catalyst in the above range accelerates the polymerization of styrene groups, so that a firm cured product can be obtained at a low temperature.

There are given below examples of curing catalyst that generate a cation or a radical species, which can initiate the polymerization of styrene groups, on heating or light irradiation. As cationic-polymerization initiators, there can be exemplified diallyliodonium salts, triallylsulfonium salts and aliphatic sulfonium salts, which contain $BF_4$, $PF_6$, $AsF_6$ or $SbF_6$ as a counter anion. There can be used commercial products such as SP-70, 172, CP-66 manufactured by Asahi Denka Co., Ltd., CI-2855, 2823 manufactured by Nippon Soda Co., Ltd., SI-100L and SI-150L manufactured by Sanshin Kagaku Kogyo Co., Ltd.

As free-radical initiators, there can be exemplified benzoin type compounds such as benzoin, benzoin methyl and the like; acetophenone type compounds such as acetophenone, 2,2-dimethoxy-2-phenylacetophenone and the like; thioxanthone type compounds such as thioxanthone, 2,4-diethylthioxanthone and the like; bisazide compounds such as 4,4'-diazidochalcone, 2,6-bis(4'-azidobenzal)cyclohexanone, 4,4'-diazidobenzophenone and the like; azo compounds such as azobisisobutyronitrile, 2,2-azobispropane, m,m'-azoxystyrene, hydrazone and the like; and organic peroxides such as 2,5-dimethyl-2,5-di(t-butylperoxy)hexane, 2,5-dimethyl-2,5-di(t-butylperoxy)hexyne-3, dicumyl peroxide and the like.

In particular, the organic peroxides or the bisazide compounds are preferably added which causes hydrogen abstraction from a compound having no functional group and can cause crosslinking between the crosslinking component and the high-molecular weight compound(s).

A polymerization inhibitor may be added to the resin composition of the present invention in order to enhance the storage stability. The amount of the polymerization inhibitor added is preferably in such a range that the dielectric characteristics and the reactivity at the time of curing are not remarkably deteriorated. The amount is preferably 0.0005 to 5 parts by weight per 100 parts by weight of the sum of the above-mentioned crosslinking component and high-molecular weight compound(s). When the polymerization inhibitor is added in the above range, excessive crosslinking reaction during storage can be suppressed and no remarkable hindrance to curing is caused during curing. The polymerization inhibitor includes, for example, quinones and aromatic diols, such as hydroquinone, p-benzoquinone, chloranil, trimethylquinone and 4-t-butylpyrocatechol.

A flame retardant may be added to the resin composition of the present invention in order to impart flame retardancy to a laminate sheet or a multilayer printed wiring board, which is obtained by the use of the resin composition. The amount of the flame retardant added is properly chosen depending on the flame retardancy grade required of the laminate sheet or the multilayer printed wiring board and the performance characteristics of the flame retardant. As a flame retardant preferably used in the present invention, there can be exemplified flame retardants whose dielectric loss tangent at a signal frequency used in a printed wiring board obtained by the use of said composition is 0.002 or less. When the signal frequency is 10 GHz, phosphorus-containing flame retardants and bromine-containing flame retardants can be exemplified which have any of the following structures A, B, C and D.

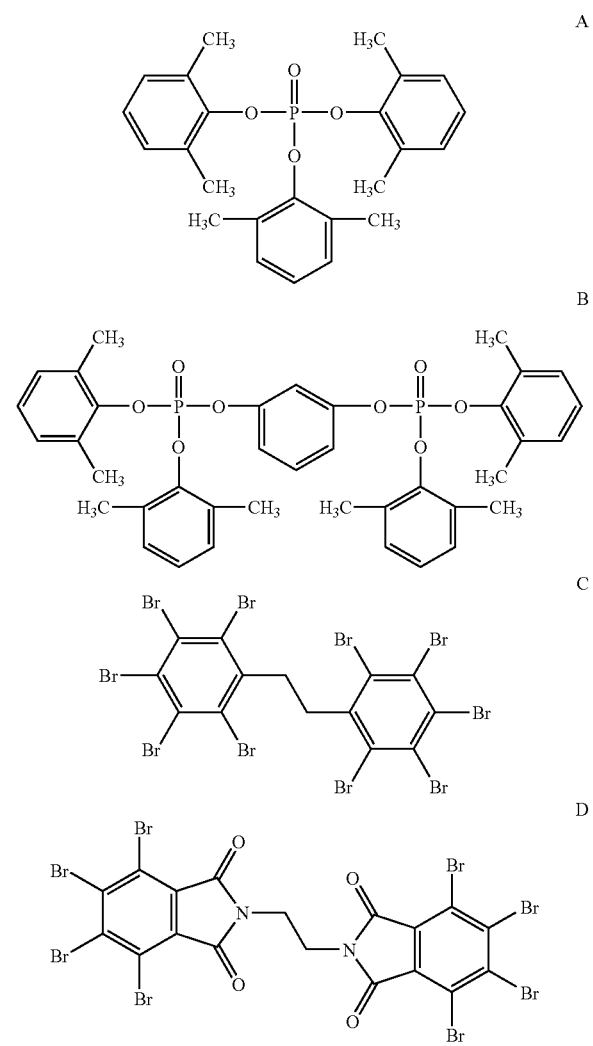

The resin composition of the present invention can be used in the form of a prepreg obtained by impregnating glass cloth or glass nonwoven fabric with the composition and then drying the composition. In this case, the dielectric loss tangent of a cured product of the prepreg can be reduced by treating the surface of the glass cloth or glass nonwoven fabric with at least one treating agent in the same manner as in the case of the inorganic filler. As the glass cloth or glass nonwoven fabric, there can be exemplified glass cloths or glass nonwoven fabrics produced from various glasses such as silicon dioxide (Q-glass), $SiO_2$—CaO—$Al_2O_3$—$B_2O_3$—MgO—$K_2O$—$Na_2O$ glass (E-glass), $SiO_2$—$Al_2O_3$—MgO—$K_2O$—$Na_2O$ glass (T-glass), $SiO_2$—$Al_2O_3$—$B_2O_3$—$K_2O$—$Na_2O$ glass (D-glass), $SiO_2$—CaO—$Al_2O_3$—$B_2O_3$—MgO—$K_2O$—$Na_2O$—$TiO_2$ glass (NE-glass) and the like.

In the present invention, by producing a prepreg by the use of glass cloth or glass nonwoven fabric, whose dielectric loss tangent at a signal frequency used in a multilayer printed wiring board produced by the use of the prepreg is 0.02 or less, there can be obtained a further improved effect of reducing the dielectric loss tangent of the insulating layer of the multilayer printed wiring board. For example, at a signal frequency of 2 GHz or less, glass cloth or glass nonwoven fabric of Q-glass, D-glass or NE-glass is preferably used. At a signal frequency of more than 2 GHz, Q-glass is preferably used.

The prepreg is produced by immersing cloth or nonwoven fabric as a substrate in a varnish prepared by the use of the resin composition, and then drying the cloth or nonwoven fabric.

Furthermore, the resin composition of the present invention can be used in the form of a resin-layer-provided conductor foil (for example, resin clad copper obtained by forming a resin layer on copper foil) produced by applying the composition on conductor foil and drying the composition. A multilayer printed wiring board formed by the use of resin clad copper has an excellent processability in perforating with a drill or a laser because it has insulating layers not containing glass cloth or glass nonwoven fabric. The drying conditions for producing the prepreg or the resin-layer-provided conductor foil are determined depending on the resin composition. For example, when toluene is used as a solvent, the drying is preferably conducted at 80 to 130° C. for approximately 30 to 90 minutes.

The prepreg of the present invention makes it possible to produce a laminate sheet having a conductor layer on each or one of the surfaces by placing conductor foil such as electrolytic-copper foil or rolled-copper foil on each or one side of the prepreg, and pressing the resulting assembly with heating. The resin-layer-provided conductor foil of the present invention makes it possible to produce a laminate sheet having a conductor layer on each side by attaching another conductor foil to the surface of the resin layer and pressing the resulting assembly with heating.

As to the preferable shape of the conductor foil used in these laminate sheets, the thickness of the conductor foil is preferably approximately 9 to 36 μm from the viewpoint of the precision of processing such as etching. The roughness of the surface of the conductor foil adhered to the prepreg or the resin layer is preferably 1 to 3 μm for reducing conductor loss and radiation loss. Employment of a conductor layer having a low surface roughness is preferable because it reduces conductor loss and radiation loss to reduce the loss of electric signals and hence does not deteriorate the excellent transmission characteristics of a multilayer printed wiring board obtained by using a resin having a low dielectric loss tangent.

In the present invention, the adhesion between the resin and conductor foil having a low surface roughness can be improved by modifying the surface of the conductor foil with at least one treating agent in the same manner as in the case of the above-mentioned inorganic filler. The improvement of the adhesiveness of a conductor layer having a low surface roughness permits prevention of problems such as peeling of the conductor layer, disconnection and the like in a production process of a multilayer printed wiring board involving the etching and the formation of a multilayer structure, which are described hereinafter.

The multilayer printed wiring board of the present invention is explained below. A first example is an example of the production of a multilayer printed wiring board by the use of the prepreg of the present invention. The conductor layer of the laminate sheet of the present invention is processed into wiring by adopting a conventional etching method, and a plurality of such laminate sheets having the wiring formed therein are laminated with the aforesaid prepregs inserted between laminate sheets so as to alternate with them, and then are pressed with heating to form a multilayer structure collectively. Thereafter, a through-hole or a blind via hole is formed by drilling or laser beam machining, and interlaminar wiring is formed by plating or with an electroconductive paste to produce the multilayer printed wiring board.

A second example is an example of the production of a multilayer printed wiring board by the use of resin clad copper. The resin-layer-provided conductor foil of the present invention is laminated on and adhered to a laminate sheet having wiring formed therein, by pressing with heating, after which the conductor layer as outer layer is processed into wiring. Then, a through-hole or a blind via hole is formed at the joining portion between the inner layer wiring and the outer layer wiring by drilling or laser beam machining, and the inner layer wiring and the outer layer wiring are connected to each other by plating or with an electroconductive paste. Thus, the multilayer printed wiring board can be produced.

A third example is an example of multilayer printed wiring board obtained by the use of a resin varnish according to the present invention. The varnish of the resin composition of the present invention is applied on a laminate sheet having wiring formed therein, dried and then cured, after which a conductor layer is formed as an outer layer by sputtering or plating. Then, the conductor layer as outer layer is processed into wiring, and a through-hole or a blind via hole is formed at the joining portion between the inner layer wiring and the outer layer wiring by drilling or laser beam machining. The inner layer wiring and the outer layer wiring are connected to each other by plating or with an electroconductive paste. Thus, the multilayer printed wiring board can be produced.

The present invention includes multilayer printed wiring boards in which a high-frequency circuit and a low-frequency circuit are mingled together and only the high-frequency circuit portion is insulated with a cured product of the composition or prepreg of the present invention. An example of such a multilayer printed wiring board is described below. Wiring is formed in a copper-clad laminate sheet having an insulating layer composed of glass cloth and an epoxy resin (this laminate sheet is abbreviated as "glass-epoxy substrate"), and then the resin-layer-provided copper foil of the present invention is laminated on and adhered to the glass-epoxy substrate by pressing. Thereafter, the copper foil as outer layer is processed into wiring to produce the multilayer printed wiring board. In this case, the inner layer wiring right on the glass-epoxy substrate can be used as wiring for low-frequency signals and the outer layer wiring can be used as wiring for high-frequency signals.

The thus obtained multilayer printed wiring board have such excellent high-frequency characteristics that dielectric loss is low because the dielectric loss tangent of the insulating layer for insulating the high-frequency circuit is low and that conductor loss and radiation loss are also low because the conductor layer having a low surface roughness is processed into each wiring.

EXAMPLES

The present invention is concretely illustrated with reference to the following examples and reference examples, which should not be construed as limiting the scope of the invention. Reagents and evaluation methods are described below.

(1) Synthesis of 1,2-bis(vinylphenyl)ethane (BVPE)

1,2-Bis(vinylphenyl)ethane (BVPE) was synthesized by the following well-known process. In a 500-ml three-necked flask was placed 5.36 g (220 mmol) of granular magnesium for Grignard reaction (mfd. by Kanto Chemical Co., Ltd.), and the flask was equipped with a dropping funnel, a nitrogen inlet tube and a septum cap. In a nitrogen stream, the whole system was desiccated with heating while stirring the magnesium granules with a stirrer.

In a syringe was place 300 ml of dried tetrahydrofuran, and injected into the flask through the septum cap. The resulting mixture was cooled to −5° C., after which 30.5 g (200 mmol) of vinylbenzyl chloride (VBC, mfd. by Tokyo Kasei Kogyo Co., Ltd.) was added dropwise thereto over a period of about 4 hours. After completion of the dropwise addition, the resulting mixture was continuously stirred at 0° C. for 20 hours. After completion of the reaction, the reaction mixture was filtered to remove the residual magnesium, and the filtrate was concentrated with an evaporator.

The concentrated solution was diluted with hexane, washed once with a 3.6% aqueous hydrochloric acid solution and three times with pure water, and then desiccated over magnesium sulfate. The desiccated solution was purified by passage through a short column of silica gel (Wako Gel C300, mfd. by Wako Pure Chemical Industries, Ltd.)/ hexane, and then dried in a vacuum to obtain BVPE. The obtained BVPE was a mixture of a m-m form (liquid), a m-p form (liquid) and a p-p form (crystals), and the yield was 90%. The structure of the obtained BVPE was investigated by $^1$H-NMR to find that the measured values agreed with the values described in literature (6H-vinyl: α-2H, 6.7, β-4H, 5.7, 5.2; 8H-aromatic: 7.1~7.35; 4H-methylene: 2.9). This BVPE was used as a crosslinking component.

(2) Other Reagents

The following were used as high-molecular weight compounds and other components.

High-Molecular Weight Compounds;
  PPE: poly-2,6-dimethyl-1,4-phenylene oxide manufactured by Aldrich Chemical Co., and
  SBD: styrene-butadiene block copolymer manufactured by Aldrich Chemical Co.

Inorganic Fillers:
  (1) $SiO_2A$: a spherical filler made of silicon dioxide (average particle size: 7 μm, and dielectric loss tangent at 10 GHz: less than 0.001), and
  (2) $SiO_2B$: a spherical filler made of silicon dioxide (average particle size: 20 μm, and dielectric loss tangent at 10 GHz: less than 0.001).

Curing Catalyst;
  25B: 2,5-dimethyl-2,5-bis(t-butylperoxy)hexyne-3 perhexyne 25B) manufactured by Nippon Oils and Fats Co., Ltd.

Flame Retardant;
  8010: SAYTEX 8010 (a bromine-containing flame retardant having a dielectric loss tangent at 10 GHz of less than 0.002) manufactured by Albemarl Corporation.

Glass Cloth;
  (1) NE cloth: cloth of NE glass (dielectric loss tangent at 10 GHz: less than 0.0036), and
  (2) $SiO_2$ cloth: glass cloth of silicon dioxide (dielectric loss tangent at 10 GHz: less than 0.001).

Copper Foil;
  Rolled copper foil having a thickness of 18 μm and an average of roughness values at 10 points (Rz) of 1.3 μm.

Treating Agent;
  KBM 503: γ-methacryloxypropyltrimethoxysilane (Shin-Etsu Silicone from Shin-Etsu Chemical Co., Ltd.).

(3) Dielectric Loss Tangent Reduction Treatment of an Inorganic Filler

A silicon dioxide filler was added to a solution of KBM 503 in methanol, and the resulting mixture was stirred with a ball mill for 8 hours. Then, the filler was collected by filtration and dried at 120° C. for 4 hours. The content of the treating agent was adjusted to 0.06 wt %, 0.3 wt % or 3.0 wt % based on the weight of the inorganic filler.

(4) Preparation Method of a Varnish

A varnish of a resin composition was prepared by dissolving predetermined amounts of the high-molecular weight compounds, the crosslinking component, the curing catalyst and the filler in chloroform.

(5) Production of a Resin Plate

The above-mentioned varnish was applied on a PET film, dried and then peeled. A predetermined amount of the peeled film was placed in a spacer made of polytetrafluoro-ethylene and was heated and pressed in a vacuum through a polyimide film and an end plate to obtain a resin plate as a cured product. The heating conditions were 180° C./100 minutes and the pressing pressure was 1.5 MPa. The dimensions of the resin plate were 70 mm×70 mm×1 mm.

(6) Dielectric Loss Tangent Reduction Treatment of Glass Cloth

Glass cloth was immersed in a 1 wt % solution of KBM 503 in methanol and allowed to stand for 8 hours. The glass cloth was taken out of the treating solution and dried at 120° C. for 4 hours to be subjected to dielectric loss tangent reduction treatment.

(7) Dielectric Loss Tangent Reduction Treatment of Copper Foil

Copper foil was immersed in a 1 wt % solution of KBM 503 in methanol and allowed to stand for 8 hours. The copper foil was taken out of the treating solution and dried at room temperature for 4 hours and then at 100° C. under a nitrogen atmosphere for 1 hour to be subjected to dielectric loss tangent reduction treatment.

(8) Production of a Prepreg

As to all the prepregs produced in Examples, they were produced by impregnating the predetermined glass cloth with the resin composition varnish and drying the varnish at room temperature for about 1 hour and then at 90° C. for 60 minutes.

(9) Production of a Cured Product of Each Prepreg

Characteristics of a cured product of each prepreg were evaluated in order to know the dielectric characteristics of a laminate sheet and a printed wiring board. Each prepreg produced by the process described above was heated and pressed in a vacuum to produce a prepreg cured product. The heating conditions were 180° C./100 minutes and the pressing pressure was 1.5 MPa. The dimensions of the prepreg cured product were 70 mm×70 mm×0.1 mm.

(10) Production of Resin Clad Copper (RCC)

Resin clad copper was produced by applying the varnish of Example 10 on copper foil subjected to dielectric loss tangent reduction treatment, and drying the varnish at room temperature for about 1 hour and then at 90° C. for 60 minutes. The thickness of the resin layer was 50 μm.

(11) Measurement of Permittivity and Dielectric Loss Tangent

A value at 10 GHz of each of permittivity and dielectric loss tangent was measured by a cavity resonance method (a network analyzer Model 8722ES manufactured by Agilent Technologies, and a cavity resonator manufactured by Kanto Electronics Application and Development Inc.).

(12) Glass Transition Temperature (Tg) and Elastic Modulus

Tg was determined with a viscoelasticity measuring apparatus (DMA) Model DVA-200 manufactured by IT Keisoku Seigyo Co., Ltd. The dimensions of a sample were 2 mm×30 mm×0.1 mm, the distance between supports was 20 mm, and the heating rate was 5° C./minute.

(13) Flame Retardancy

Samples for evaluating flame retardancy were obtained by cutting each of the previously produced resin plate and prepreg cured product to dimensions of 10 mm×70 mm. A test for flammability was carried out 10 times according to UL-94 standard, and a sample having an average combustion time of 5 seconds or less and a maximum combustion time of 10 seconds or less was rated V0.

(14) Peel Strength

Samples for measuring peel strength were produced as follows. The rough surface of copper foil was attached to each side of the previously produced prepreg, and the resulting assembly was heated and pressed in a vacuum through a polyimide film and an end plate to produce a laminate sheet. The heating conditions were 180° C./100 minutes and the pressing pressure was 4.5 MPa. The dimensions of the laminate sheet were 70×70×0.14 mm. The copper foil of the laminate sheet was cut to a width of 10 mm and the peel strength of the resulting piece of the copper foil was measured.

Comparative Example 1

Comparative Example 1 is a resin composition containing no inorganic filler. Table 3 shows the make-up and dielectric characteristics of the resin composition. The permittivity at 10 GHz was 2.4 and the dielectric loss tangent was 0.002.

TABLE 3

|  | Comparative Example 1 | Comparative Example 2 | Comparative Example 3 | Comparative Example 4 |
|---|---|---|---|---|
| BVPE (parts by weight) | 50 | 50 | 50 | 50 |
| PPE (parts by weight) | 50 | 50 | 50 | 50 |
| SBD (parts by weight) | 5 | 5 | 5 | 5 |

TABLE 3-continued

|  | Comparative Example 1 | Comparative Example 2 | Comparative Example 3 | Comparative Example 4 |
|---|---|---|---|---|
| $SiO_2A$ (parts by weight/vol %) | 0 | 50/18 | 200/45 | 300/56 |
| 25B (parts by weight) | 0.5 | 0.5 | 0.5 | 0.5 |
| Concentration (wt %) of the treating agent relative to the filler | 0 | 0 | 0 | 0 |
| Concentration (parts by weight) of the treating agent per 100 parts by weight of the resin composition | 0 | 0 | 0 | 0 |
| Permittivity | 2.4 | 2.7 | 3 | 3.2 |
| Dielectric loss tangent | 0.002 | 0.002 | 0.002 | 0.002 |

Comparative Examples 2 to 4

Comparative Examples 2 to 4 are resin compositions obtained by adding various amounts of an inorganic filler not subjected to dielectric loss tangent reduction treatment. Table 3 also shows the make-ups and dielectric characteristics of these compositions. The value of the dielectric loss tangent was hardly improved in spite of the addition of the inorganic filler having a low dielectric loss tangent.

Examples 1 to 9

Examples 1 to 9 are resin compositions obtained by adding an inorganic filler subjected to each of various dielectric loss tangent reduction treatments. Table 1 shows the make-ups and characteristics of these compositions. The dielectric loss tangent of the compositions of Comparative Examples 2 to 4 containing the inorganic filler not subjected to dielectric loss tangent reduction treatment was 0.002, while the dielectric loss tangent of the compositions of Examples 1 to 9 containing the filler subjected to each dielectric loss tangent reduction treatment was 0.0011~0.0017, an improved value. By this fact, it was confirmed that the dielectric loss tangent is reduced by the addition of the filler subjected to each dielectric loss tangent reduction treatment.

TABLE 1

|  | Example 1 | Example 2 | Example 3 | Example 4 | Example 5 | Example 6 | Example 7 | Example 8 | Example 9 |
|---|---|---|---|---|---|---|---|---|---|
| BVPE (parts by weight) | 50 | 50 | 50 | 50 | 50 | 50 | 50 | 50 | 50 |
| PPE (parts by weight) | 50 | 50 | 50 | 50 | 50 | 50 | 50 | 50 | 50 |
| SBD (parts by weight) | 5 | 5 | 5 | 5 | 5 | 5 | 5 | 5 | 5 |
| $SiO_2A$ (parts by weight/vol %) | 50/18 | 100/30 | 200/45 | 50/18 | 100/30 | 200/45 | 50/18 | 100/30 | 200/45 |
| 25B (parts by weight) | 0.5 | 0.5 | 0.5 | 0.5 | 0.5 | 0.5 | 0.5 | 0.5 | 0.5 |
| Concentration (wt %) of the treating agent relative to | 0.06 | 0.06 | 0.06 | 0.3 | 0.3 | 0.3 | 3 | 3 | 3 |

TABLE 1-continued

|  | Example 1 | Example 2 | Example 3 | Example 4 | Example 5 | Example 6 | Example 7 | Example 8 | Example 9 |
|---|---|---|---|---|---|---|---|---|---|
| the filler Concentration (parts by weight) of the treating agent per 100 parts by weight of the resin composition | 0.02 | 0.03 | 0.04 | 0.1 | 0.15 | 0.19 | 0.96 | 1.46 | 1.96 |
| Permittivity | 2.7 | 2.8 | 3 | 2.7 | 2.8 | 3 | 2.7 | 2.8 | 3 |
| Dielectric loss tangent | 0.0011 | 0.0012 | 0.0014 | 0.0014 | 0.0015 | 0.0016 | 0.0015 | 0.0016 | 0.0017 |

Examples 10 to 12

Examples 10 to 12 are resin compositions containing an inorganic filler subjected to dielectric loss tangent reduction treatment and a flame retardant 8010 having a low dielectric loss tangent. Table 2 shows the make-ups and characteristics of these compositions. It was confirmed that both a high flame retardancy and a very low dielectric loss tangent can be attained by the addition of the inorganic filler subjected to dielectric loss tangent reduction treatment and the employment of the flame retardant having a low dielectric loss tangent.

TABLE 2

|  | Example 10 | Example 11 | Example 12 |
|---|---|---|---|
| BVPE (parts by weight) | 50 | 50 | 50 |
| PPE (parts by weight) | 50 | 50 | 50 |
| SBD (parts by weight) | 5 | 5 | 5 |
| SiO$_2$B (parts by weight/vol %) | 50 | 100 | 200 |
| 25B (parts by weight) | 0.5 | 0.5 | 0.5 |
| 8010 | 40 | 40 | 40 |
| Concentration (wt %) of the treating agent relative to the filler | 0.06 | 0.06 | 0.06 |
| Concentration (parts by weight) of the treating agent per 100 parts by weight of the resin composition | 0.02 | 0.02 | 0.03 |
| Permittivity | 2.7 | 2.8 | 3 |
| Dielectric loss tangent | 0.0011 | 0.0012 | 0.0013 |
| Flame retardancy | V0 | V0 | V0 |

Examples 13 to 16

Examples 13 to 16 are prepregs obtained by impregnating glass cloth with the resin composition of Example 10 of the present invention. The dielectric loss tangent of a cured product of the prepreg of Example 13 obtained by using NE cloth not subjected to dielectric loss tangent reduction treatment was 0.002. Thus, it was confirmed that the dielectric loss tangent of the prepreg cured product had an increased value owing to the influence of the dielectric loss tangent of NE cloth.

On the other hand, the dielectric loss tangent of a cured product of the prepreg of Example 14 obtained by using NE cloth subjected to dielectric loss tangent reduction treatment was 0.0016, namely, the increase of the dielectric loss tangent was suppressed as compared with Example 13. By this fact, it was confirmed that the dielectric loss tangent reduction treatment of the glass cloth is effective in reducing the dielectric loss tangent of the prepreg cured product. The dielectric loss tangent of a cured product of the prepreg of Example 15 obtained by using SiO$_2$ cloth not subjected to dielectric loss tangent reduction treatment was 0.0011, which was substantially the same as the dielectric loss tangent of a cured product of the resin composition of Example 10.

On the other hand, the dielectric loss tangent of a cured product of the prepreg of Example 16 obtained by using SiO$_2$ cloth subjected to dielectric loss tangent reduction treatment was 0.0009, a reduced value. All of the cured products of the prepregs of Examples 13 to 16 had a good flame retardancy and a high glass transition temperature of 220° C. Therefore, they are considered suitable as a component in a multilayer printed wiring board for high frequency. Table 4 shows the results described above.

TABLE 4

|  | Example 13 | Example 14 | Example 15 | Example 16 |
|---|---|---|---|---|
| Resin Composition | The same as in Example 10 | | | |
| Glass cloth | NE Cloth | | SiO$_2$ cloth | |
| Dielectric loss tangent reduction treatment | No | Yes | No | Yes |
| Resin content | 55 | 55 | 55 | 55 |
| Permittivity | 3.1 | 3.1 | 3 | 3 |
| Dielectric loss tangent | 0.002 | 0.0016 | 0.0011 | 0.0009 |
| Flame retardancy | V0 | V0 | V0 | V0 |
| Glass transition temperature | 220 | 220 | 220 | 220 |

Examples 17 to 20

Table 5 shows the peel strength of laminate sheets of Examples 17 to 20 produced by using each of the prepregs of Examples 14 and 16 of the present invention and rolled copper foil having an average of surface roughness values at 10 points of 1.3 μm. The copper foil used in the laminate sheets of Examples 17 and 19 was that not subjected to dielectric loss tangent reduction treatment, and both of these laminate sheets had a peel strength of 0.4 kN/m. On the other hand, the laminate sheets of Examples 18 and 20, the copper foil of which was that subjected to dielectric loss tangent reduction treatment, had an improved peel strength of 0.8 kN/m. Thus, it was confirmed that the dielectric loss tangent reduction treatment of the copper foil is effective in improving the peel strength.

Table 5

TABLE 5

|  | Example 17 | Example 18 | Example 19 | Example 20 |
|---|---|---|---|---|
| Structure of a prepreg | The same as Example 14 | | The same as Example 16 | |
| Dielectric loss tangent reduction treatment of copper foil | No | Yes | No | Yes |
| Peel strength (kN/m) | 0.4 | 0.8 | 0.4 | 0.8 |

Example 21

FIG. 1 shows an example of the production of a first multilayer printed wiring board of the present invention.

(A) A photoresist (HS 425, mfd. by Hitachi Chemical Co., Ltd.) was laminated on one side of the double-wall copper-clad laminate sheet obtained in Example 20, and the whole surface of the photoresist was exposed to light. Then, a photoresist (HS 425, mfd. by Hitachi Chemical Co., Ltd.) was laminated on the other copper surface and exposed to light according to a test pattern, and the unexposed portion of the photoresist was developed with a 1% sodium carbonate solution.

(B) The exposed portion of the copper foil was removed by etching with an etching solution containing 5% sulfuric acid and 5% hydrogen peroxide, to form conductor wiring on one side of the double-wall copper-clad laminate sheet.

(C) The residual photoresist was removed with a 3% sodium hydroxide solution to obtain a wiring board having the wiring on one side. Two wiring board were produced in the same manner as above.

(D) The prepreg of Example 16 was held between the wiring sides of the two wiring boards and the resulting assembly was heated and pressed in a vacuum to form a multilayer structure. The heating conditions were 180° C./100 minutes and the pressing pressure was 4 MPa.

(E) A photoresist (HS 425, mfd. by Hitachi Chemical Co., Ltd.) was laminated on the outer layer copper on each side of the produced multilayer board and exposed to light according to a test pattern, and the unexposed portion of the photoresist was developed with a 1% sodium carbonate solution.

(F) The exposed portion of the copper foil was removed by etching with an etching solution containing 5% sulfuric acid and 5% hydrogen peroxide, and the residual photoresist was removed with a 3% sodium hydroxide solution to form outer layer wirings.

(G) A through-hole for connecting the inner layer wirings and the outer layer wirings was formed by drilling.

(H) The wiring board thus obtained was immersed in a colloidal solution of a plating catalyst to place the catalyst in the through-hole and on the board surface.

(I) After the activation of the plating catalyst, seed films of about 1 μm were formed by electroless plating (CUST 2000, mfd. by Hitachi Chemical Co., Ltd.).

(J) A photoresist (HN 920, mfd. by Hitachi Chemical Co., Ltd.) was laminated on each side of the wiring board.

(K) The through-hole portion and the edges of the wiring board were masked and the wiring board was exposed to light, followed by development with 3% sodium carbonate. Thus, openings were formed.

(L) Electrodes were set at the edges of the wiring board and a plated copper film was formed in a thickness of about 18 μm on the through portion by electroplating.

(M) The electrode portions were cut off and the residual photoresist was removed with a 5% aqueous sodium hydroxide solution.

(N) The wiring board was immersed in an etching solution containing 5% sulfuric acid and 5% hydrogen peroxide, to conduct etching to a thickness of about 1 μm, to remove the seed films. Thus, the multilayer wiring board was produced.

In the case of this multilayer wiring board, disconnection of the wiring or peeling of the wiring was not caused in the formation of the multilayer structure. In addition, when the multilayer wiring board was held in a reflow bath of molten solder at 200° C. for 10 minutes and then in a bath of molten solder at 288° C. for 2 minutes, peeling of the resin boundary surface or the wiring, or the like was not caused.

Example 22

Figure 2:
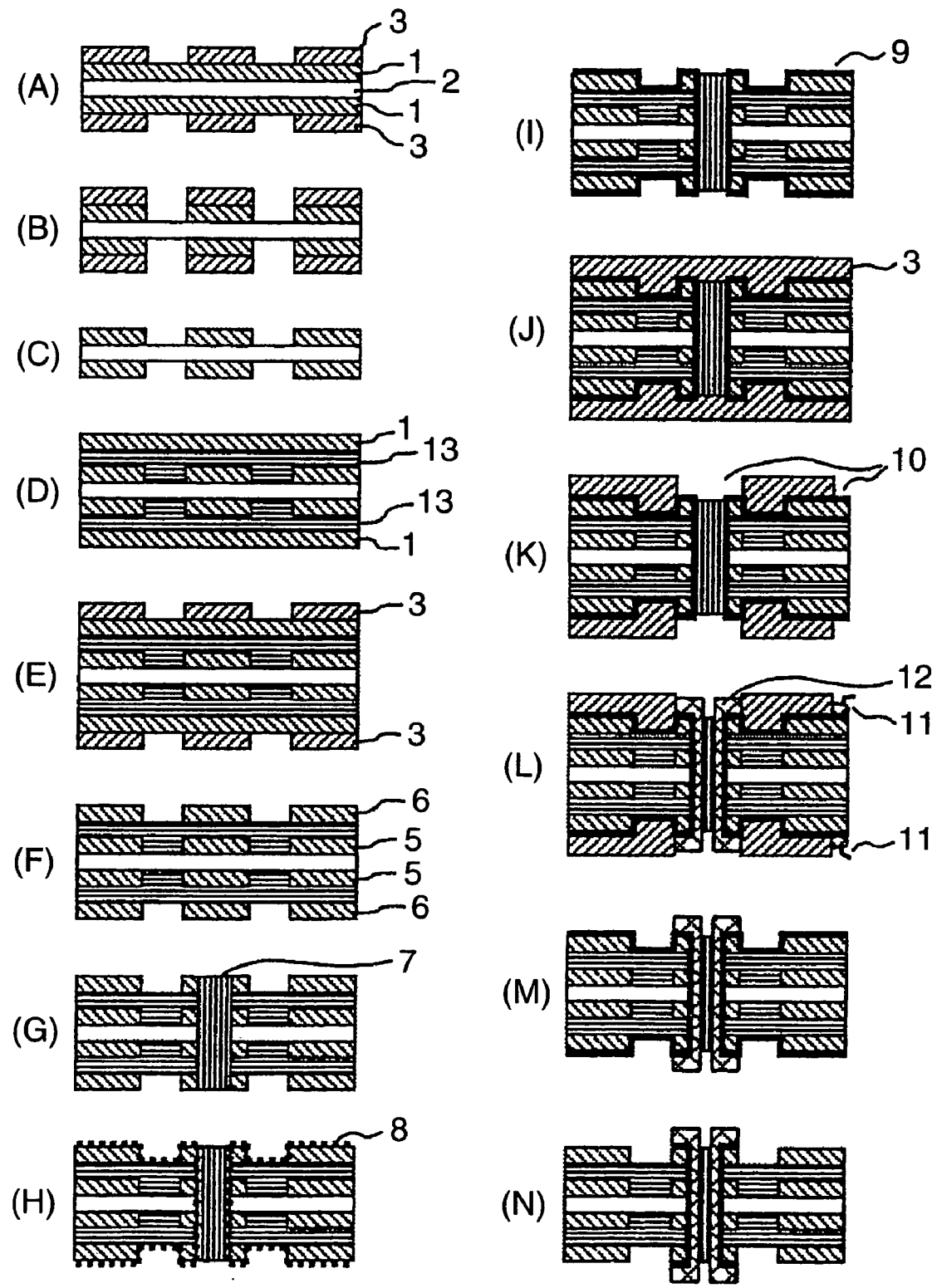
FIG. 2 is a schematic diagram showing a process for producing a multilayer wiring board in another example.

FIG. 2 shows an example of the production of a second multilayer printed wiring board of the present invention.

(A) A photoresist (HS 425, mfd. by Hitachi Chemical Co., Ltd.) was laminated on each side of the double-wall copper-clad laminate sheet obtained in Example 20, and then was exposed to light according to a test pattern, and the unexposed portion of the photoresist was developed with a 1% sodium carbonate solution.

(B) The exposed portion of the copper foil was removed by etching with an etching solution containing 5% sulfuric acid and 5% hydrogen peroxide, to form conductor wiring on each side of the laminate sheet.

(C) The residual photoresist was removed with a 3% sodium hydroxide solution to obtain a wiring board having the wiring on each side.

(D) The wiring board was held between two sheets of RCC having on the surface a resin layer made of the composition of Example 10, and the resulting assembly was heated and pressed in a vacuum to form a multilayer structure. The heating conditions were 180° C./100 minutes and the pressing pressure was 4 MPa.

(E) A photoresist (HS 425, mfd. by Hitachi Chemical Co., Ltd.) was laminated on the outer layer copper on each side of the produced multilayer board and exposed to light according to a test pattern, and the unexposed portion of the photoresist was developed with a 1% sodium carbonate solution.

(F) The exposed portion of the copper foil was removed by etching with an etching solution containing 5% sulfuric acid and 5% hydrogen peroxide, and the residual photoresist was removed with a 3% sodium hydroxide solution to form the outer layer wirings.

(G) A through-hole for connecting the inner layer wirings and the outer layer wirings was formed by drilling.

(H) The wiring board thus obtained was immersed in a colloidal solution of a plating catalyst to place the catalyst in the through-hole and on the board surface.

(I) After the activation of the plating catalyst, seed films of about 1 μm were formed by electroless plating (CUST 2000, mfd. by Hitachi Chemical Co., Ltd.).

(J) A photoresist (HN 920, mfd. by Hitachi Chemical Co., Ltd.) was laminated on each side of the wiring board.

(K) The through-hole portion and the edges of the wiring board were masked and the wiring board was exposed to light, followed by development with 3% sodium carbonate. Thus, openings were formed.

(L) Electrodes were set at the edges of the wiring board and a plated copper film was formed in a thickness of about 18 μm on the through portion by electroplating.

(M) The electrode portions were cut off and the residual photoresist was removed with a 5% aqueous sodium hydroxide solution.

(N) The wiring board was immersed in an etching solution containing 5% sulfuric acid and 5% hydrogen peroxide, to conduct etching to a thickness of about 1 μm, to remove the seed films. Thus, the multilayer wiring board was produced.

In the case of this multilayer wiring board, disconnection of the wiring or peeling of the wiring was not caused in the formation of the multilayer structure. In addition, when the multilayer wiring board was held in a reflow bath of molten solder at 200° C. for 10 minutes and then in a bath of molten solder at 288° C. for 2 minutes, peeling of the resin boundary surface or the wiring, or the like was not caused.

Example 23

This example is a case where an inorganic filler was treated with a treating agent unreactive to the polyfunctional styrene compound, i.e., a compound of the above-mentioned group (2).

The inorganic filler $SiO_2$ (A) was previously treated with 0.3 wt % mercaptotrimethoxysilane. The thus treated inorganic filler was added to the resin composition of Example 1 in an amount of 50 wt %, and a resin plate was molded by the predetermined method. The permittivity at 10 GHz of the obtained resin plate was 2.8% and its dielectric loss tangent was 0.0015. Since the dielectric loss tangent was lower than that of the composition of Comparative Example 1, it was confirmed that the treating agent unreactive to styrene group is also effective in reducing the dielectric loss tangent of the cured product.

Examples 24 to 27

In these examples, the dielectric loss tangent of cured products of resin compositions containing various flame retardants, respectively, was measured. The flame retardants A, B, C and D added are the same compounds as described above. Table 6 shows the make-ups of the resin compositions and the permittivity and dielectric loss tangent of the cured products.

TABLE 6

| | Example 24 | Example 25 | Example 26 | Example 27 |
|---|---|---|---|---|
| BVPE (parts by weight) | 50 | 50 | 50 | 50 |
| PPE (parts by weight) | 50 | 50 | 50 | 50 |
| SBD (parts by weight) | 5 | 5 | 5 | 5 |
| 25B (parts by weight) | 0.5 | 0.5 | 0.5 | 0.5 |

TABLE 6-continued

| | Example 24 | Example 25 | Example 26 | Example 27 |
|---|---|---|---|---|
| Flame retardant A | — | — | 40 | — |
| Flame retardant B | — | — | — | 40 |
| Flame retardant C | 40 | — | — | — |
| Frame retardant D | — | 40 | — | — |
| Permittivity | 2.5 | 2.5 | 2.5 | 2.6 |
| Dielectric loss tangent | 0.0016 | 0.0017 | 0.0017 | 0.0018 |

The resin composition of the present invention is suitable as an insulating material for electrical parts for high frequency and can be used in a wiring board for high-frequency signal and a prepreg used in the wiring board. In addition, according to the present invention, the dielectric loss tangent of a prepreg composed of a composite of the resin composition and glass cloth or glass nonwoven fabric can be markedly reduced and moreover, the peel strength between the prepreg and conductor foil having a low surface roughness can be increased. Accordingly, a multilayer printed wiring board excellent in both high-frequency characteristics and reliability can be obtained.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A resin composition comprising:

a crosslinking component with a weight average molecular weight of 1,000 or less having a plurality of styrene groups and represented by the following general formula:

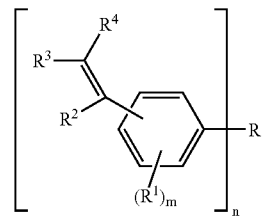

wherein R is a hydrocarbon skeleton; each of $R^1$s, which may be the same or different, is a hydrogen atom or a hydrocarbon group of 1 to 20 carbon atoms; each of $R^2$, $R^3$ and $R^4$, which may be the same or different, is a hydrogen atom or an alkyl group of 1 to 6 carbon atoms; m is an integer of 1 to 4; and n is an integer of 2 or more, at least one high-molecular weight compound with a weight average molecular weight of 5,000 or more, an inorganic filler having a dielectric loss tangent of 0.002 or less, and at least one treating agent having a functional group reactive to a styrene group, wherein said at least one treating agent is selected from the group consisting of dimethylvinylmethoxysilane, methylvinyldimethox ysilane, γ-methacryloxypropyltrimethoxysilane, vinyltrichlorosilane, vinyltrimethoxysilane, vinyltriethoxysilane, p-styryltrimethoxysilane, 3-methacryloxypropyltrimethoxysilane and 3-acryloxypropyltrimethoxysilane.

2. The resin composition according to claim 1, wherein said treating agent is supported on the surface of said inorganic filler.

3. The resin composition according to claim 1, characterized by containing, as said at least one treating agent, at least one reactive treating agent having a functional group chemically bondable to the polyfunctional styrene compound.

4. The resin composition according to claim 1, wherein said inorganic filler has an average particle size of 0.5 to 60 μm.

5. The resin composition according to claim 1, wherein said at least one high-molecular weight compound is at least one resin selected from the group consisting of polymers comprising repeating units derived from at least one of butadiene, isoprene, styrene, methylstyrene, ethylstyrene, divinylbenzene, acrylic esters, acrylonitrile, N-phenylmaleimide and N-vinylphenylmaleimide; substituted or unsubstituted polyphenylene oxides; and polyolefins having an alicyclic structure.

6. The resin composition according to claim 1, which further comprises at least one flame retardant represented by the following general formulas:

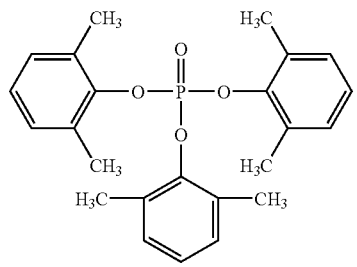
A

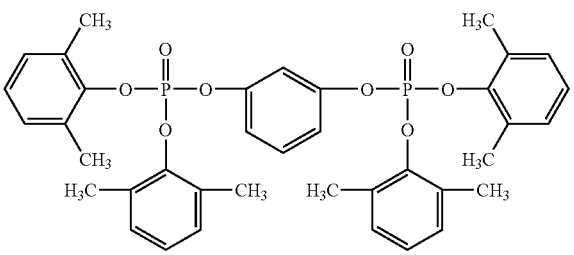
B

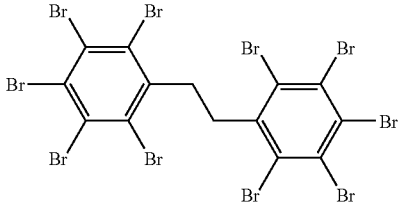
C

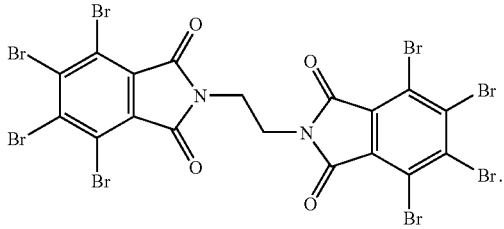
D

7. The resin composition according to claim 5, wherein $R^1$, $R^2$, $R^3$ and $R^4$ are each hydrogen, and said at least one high-molecular weight compound is polyphenylene oxide.

8. The resin composition according to claim 6, wherein $R^1$, $R^2$, $R^3$ and $R^4$ are each hydrogen, said at least one high-molecular weight compound is polyphenylene oxide, and the at least one flame retardant is the general formula C.

9. The resin composition according to claim 1, wherein said at least one treating agent serves to reduce a dielectric loss tangent of a product produced by curing said resin composition, as compared with a dielectric loss tangent of a product produced by curing a resin composition of said crosslinking component, said at least one high-molecular weight compound and said inorganic filler but not said at least one treating agent.

* * * * *